(12) United States Patent
Liu et al.

(10) Patent No.: US 11,112,669 B2
(45) Date of Patent: Sep. 7, 2021

(54) ARRAY SUBSTRATE AND DISPLAY PANEL

(71) Applicant: TCL China Star Optoelectronics Technology Co., Ltd., Shenzhen (CN)

(72) Inventors: Junzheng Liu, Shenzhen (CN); Kai Hu, Shenzhen (CN); Rong Zhao, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 54 days.

(21) Appl. No.: 16/623,770

(22) PCT Filed: Dec. 5, 2019

(86) PCT No.: PCT/CN2019/123179
§ 371 (c)(1),
(2) Date: Dec. 18, 2019

(87) PCT Pub. No.: WO2020/114499
PCT Pub. Date: Jun. 11, 2020

(65) Prior Publication Data
US 2021/0208465 A1    Jul. 8, 2021

(51) Int. Cl.
*G02F 1/1345* (2006.01)
*G02F 1/1362* (2006.01)
*H01L 27/12* (2006.01)

(52) U.S. Cl.
CPC ...... *G02F 1/136295* (2021.01); *G02F 1/1345* (2013.01); *H01L 27/124* (2013.01)

(58) Field of Classification Search
CPC ......... G02F 1/136286; G02F 1/136295; G02F 1/13452; G02F 1/1345; G02F 1/1343; G02F 1/134309; G02F 1/13439; G02F 1/1333; G02F 1/133337; G02F 1/133345; G02F 1/133388; G02F 1/1368; G02F 1/1362; G02F 1/13629; G02F 1/13458; H01L 27/124; H01L 27/3276; G09G 2300/0426
See application file for complete search history.

(56) References Cited

U.S. PATENT DOCUMENTS

| | | | |
|---|---|---|---|
| 9,153,599 B2 | 10/2015 | Koo et al. | |
| 2006/0175611 A1 | 8/2006 | Tanaka et al. | |
| 2007/0019122 A1* | 1/2007 | Lee | H01L 27/124 349/43 |

FOREIGN PATENT DOCUMENTS

| | | |
|---|---|---|
| CN | 1601360 | 3/2005 |
| CN | 105870131 | 8/2016 |
| CN | 107706196 | 2/2018 |
| KR | 2005-0003515 | 1/2005 |
| KR | 2006-0074735 | 7/2006 |

\* cited by examiner

*Primary Examiner* — Thoi V Duong

(57) ABSTRACT

The present invention provides an array substrate and a display panel. The display panel includes the array substrate, a non-display region of the array substrate includes a fan-out region and a bonding pad region, and each fan-out lines of the fan-out region includes a first metal layer, a second metal layer, a third metal layer, and a fourth metal layer, which are arranged in a stack and are different materials.

10 Claims, 2 Drawing Sheets

ARRAY SUBSTRATE AND DISPLAY PANEL

RELATED APPLICATIONS

This application is a National Phase of PCT Patent Application No. PCT/CN2019/123179 having International filing date of Dec. 5, 2019, which claims the benefit of priority of Chinese Patent Application No. 201911172765.2 filed on Nov. 26, 2019. The contents of the above applications are all incorporated by reference as if fully set forth herein in their entirety.

FIELD AND BACKGROUND OF THE INVENTION

The present disclosure relates to the field of display technology, and more particularly, to an array substrate and a display panel.

At present, corrosion in a peripheral wiring of liquid crystal display panels has always been a difficult and an emphasis for improvement in the liquid crystal display industry, and is particularly prone to corrode bonding pads in deep-holes and short-holes of IC bonding. Corrosion of the bonding pads has persistence, and type of the corrosion is pitting. When pitting occurs, metal in the pitting will dissolve, especially some of the metal forming metal layer of the bonding pads and external impurity metal intruding into the deep-holes.

As shown in FIG. 1, FIG. 1 is a schematic structural diagram of an array substrate of a peripheral wiring of a liquid crystal display panel in the prior art. An array substrate 90 comprises a fan-out line 91, an insulating layer 92, a passivation layer 93, an electrode layer 94, and a barrier layer 95, which are arranged in a stack. There are chlorine and water oxygen erosion when cleaning the array substrate, and the array substrate is eroded to form eroded holes or there are deep-holes and short-holes in the array substrate. If it is in an aqueous solution containing Cl ions, a cathode reaction is an oxygen absorption reaction. Since oxygen in the holes is continuously consumed, concentration of the oxygen in the holes is decreased, while the solution outside of the pitting remains rich in oxygen, forming an "oxygen concentration cell". Therefore, a fan-out line 91 as an anode and an electrode layer 94 as a cathode. Some of the reactions involved at the anode are mainly $In_2O_3+6H^+\rightarrow 2In^{3+}+3H_2O$, and some of the reactions involved at the cathode are mainly $2H_2O\rightarrow O_2+4H^++4e^-$, $M\rightarrow M^{n+}+ne^-$, and $4Cl^-\rightarrow 2Cl_2+4e^-$. That is, cations are in the holes, and the cations are continuously increased due to metals dissolved. In order to maintain electric neutrality, anions (Cl$^-$ ions) migrate from outside hole into inside hole, chloride in the holes is concentrated and performs hydrolysis, and its reaction formula is $M^{n+}+nH_2O\rightarrow M(OH)_n+nH^+$. Wherein, M comprises some metals forming the fan-out line 91 and impurity metals invading the deep-holes from the outside. Therefore, it further promotes anodic dissolution and produces more the cations, which keeps circulation until the hole is completely destroyed, and corrosion is accelerated due to potential difference.

Since a structure of the fan-out line 91 is roughly a two-layer metal structure or a three-layer metal structure, which is prone to be dissolved. Thus, it needs to design a new array substrate and a display panel to overcome defects in the prior art.

SUMMARY OF INVENTION

To resolve the defects and disadvantages above mentioned in the prior art, the present disclosure provides an array substrate and a display panel, which is designed for corrosion protection, a metal structure of bonding pads is changed to increase product corrosion resistance.

One of embodiment in the present disclosure provides an array substrate comprising a display region and a non-display region. The non-display region comprises a fan-out region and a bonding pad region. The bonding pad region comprises a plurality of bonding pads, and each fan-out lines is one-to-one connected to one of the bonding pads. Each of the fan-out lines comprises a first metal layer, a second metal layer disposed on the first metal layer, a third metal layer disposed on the second metal layer, and a fourth metal layer disposed on the third metal layer. Wherein materials of the first metal layer, the second metal layer, the third metal layer, and the fourth metal layer are all different.

Further, each of the fan-out lines comprises a fifth metal layer disposed on the fourth metal layer.

Further, a material of the fifth metal layer is the same as the material of the third metal layer Further, a material of the first metal layer comprises one of Ti, Cr, or Zr.

Further, a material of the second metal layer comprises Ni.

Further, a material of the third metal layer comprises Mo.

Further, a material of the fourth metal layer comprises Cu or Al.

Further, the fan-out region comprises an insulating layer disposed on both sides above the fan-out lines and exposing the fan-out lines in a middle portion of the insulating layer, a passivation layer disposed on the insulating layer and exposing the fan-out lines in the middle portion of the passivation layer, and an electrode layer disposed on the insulating layer and the fan-out lines.

One of embodiment of the present disclosure provides a display panel comprising the array substrate above mentioned.

A technical effect of the present disclosure is to provide an array substrate and a display panel, which is designed for increasing product corrosion resistance by changing a metal structure of fan-out line.

BRIEF DESCRIPTION OF THE SEVERAL VIEWS OF THE DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

Figure 1:
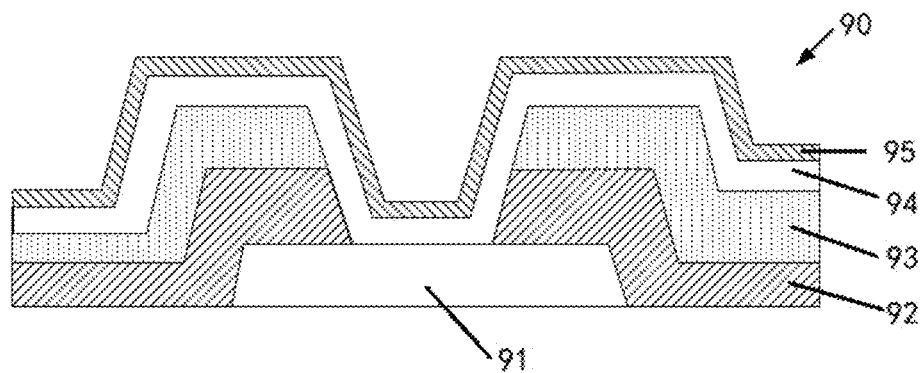
FIG. 1 is a schematic structural diagram of an array substrate in the prior art.

Figure numerals: fan-out line 1, insulating layer 2, passivation layer 3, electrode layer 4, barrier layer 5, display region 10, first metal layer, second metal layer 12, third metal layer 13, fourth metal layer 14, fifth metal layer 15, non-display region 20, fan-out region 21, bonding pad region 22, array substrate 100, pixel unit 110, fan-out line 210, driving voltage lines 211, 212, data voltage line 213, bonding pad 220, driving transmission pad 221, 222, and data transmission pad 223.

DESCRIPTION OF SPECIFIC EMBODIMENTS OF THE INVENTION

The following description of the embodiments with reference to the appended drawings is used for illustrating specific embodiments which may be used for carrying out the present disclosure. The directional terms described by the present disclosure, such as upper, lower, front, back, left, right, inner, outer, side, etc., are only directions by referring to the accompanying drawings. Thus, the adopted directional terms are used to describe and understand the present disclosure, but the present disclosure is not limited thereto. In figures, elements with similar structures are indicated by the same numbers.

In the present disclosure, the terms "mounting", "connected", "fixed" and the like should be broadly understood unless expressly stated or limited otherwise. For example, it may be fixed connected, removably connected, or integrated; it may be mechanically connected, or an electrically connected; it may be directly connected, or indirectly connected through an intermediary; it may be a connection between two elements or an interaction between two elements. For those skilled in the art, the specific meanings of the above terms in the present disclosure may be understood based on specific situations.

Figure 2:
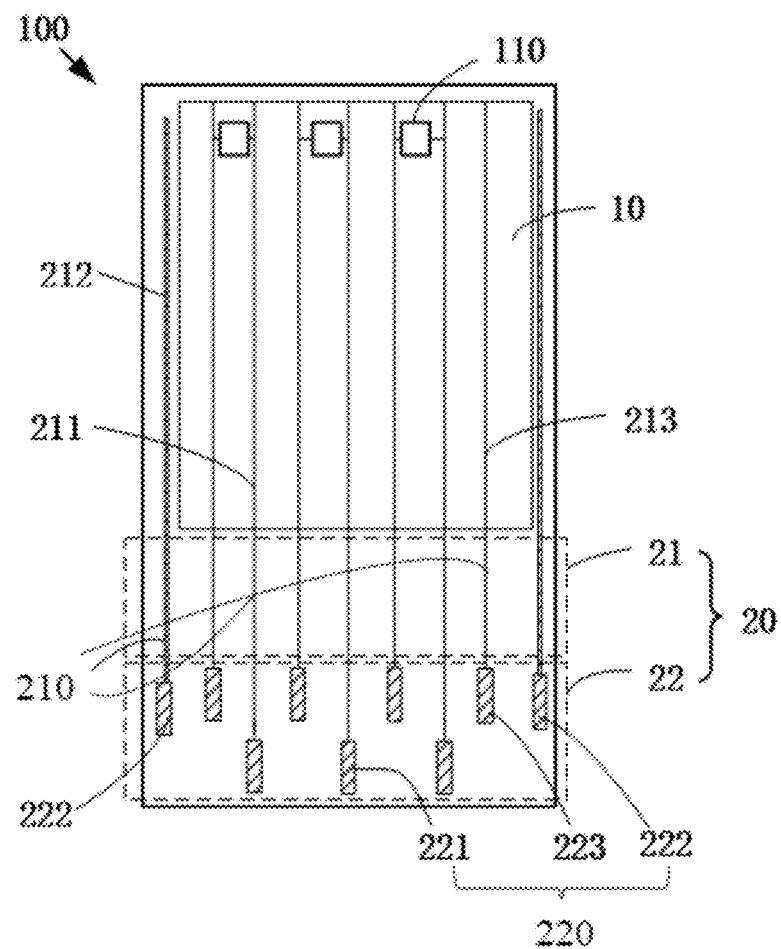
FIG. 2 is a schematic structural diagram of an array substrate in an embodiment of the present disclosure.

As shown in FIG. 2, an embodiment of the present disclosure provides an array substrate 100 comprising a display region 10 and a non-display region 20. A plurality of pixel units 110 are disposed on the display region 10, and each of the pixel units is connected to corresponding driving voltage lines 211-212, and data voltage lines 213, The non-display region 20 comprises a fan-out region 21 and a bonding pad region 22, the fan-out region comprises a plurality of fan-out lines 210, the fan-out lines 210 are formed by the driving voltage lines 211-212 and the data voltage lines 213 extending in the fan-out region 21, the bonding pad region 22 comprises a plurality of bonding pads 220, each of the fan-out lines 210 is correspondingly connected to one of the bonding pads 220, which respectively, correspond to a plurality of driving transmission pads 221-222 and a plurality of data transmission pads 223. Specifically, the plurality of driving voltage lines 211-212 are one-to-one connected to the plurality of driving transmission pads 221-222, and the plurality of data voltage lines 213 are one-to-one connected to the plurality of data transmission pads 223.

In the present disclosure, the bonding pads 220 are used for bonding a driving circuit (not shown), and the data transmission pads 220 are used for receiving a data voltage Vdata transmitted by an image processor in the driving circuit and transmitting the data voltage Vdata to the corresponding pixel unit 110 through the data voltage lines 213. The driving transmission pads 221-222 are used for respectively transmitting high/low level driving voltages Vdd/Vss and transmitting the driving voltages Vdd/Vss to the corresponding pixel unit 110 through the driving voltage lines 211-212.

In should be noted that, in other embodiments, the bonding pads 220 are used for bonding a driving circuit, the driving circuit may provide a driving signal to data lines; or may provide a driving signal to a gate layer; or may provide a touch control signal to read signal line of an array substrate 100; or may also provide a clock signal and a voltage source (VSS, VDD, VGL, VGH, etc.) for an array substrate 100 having a GOA (Gate Driver on Array) circuit, and the present disclosure does not limit it.

There are chlorine and water oxygen erosion when cleaning the array substrate 100, and the array substrate is eroded to form an eroded hole or there are deep-holes and short-holes in a wiring, so it is prone to be eroded.

Figure 3:
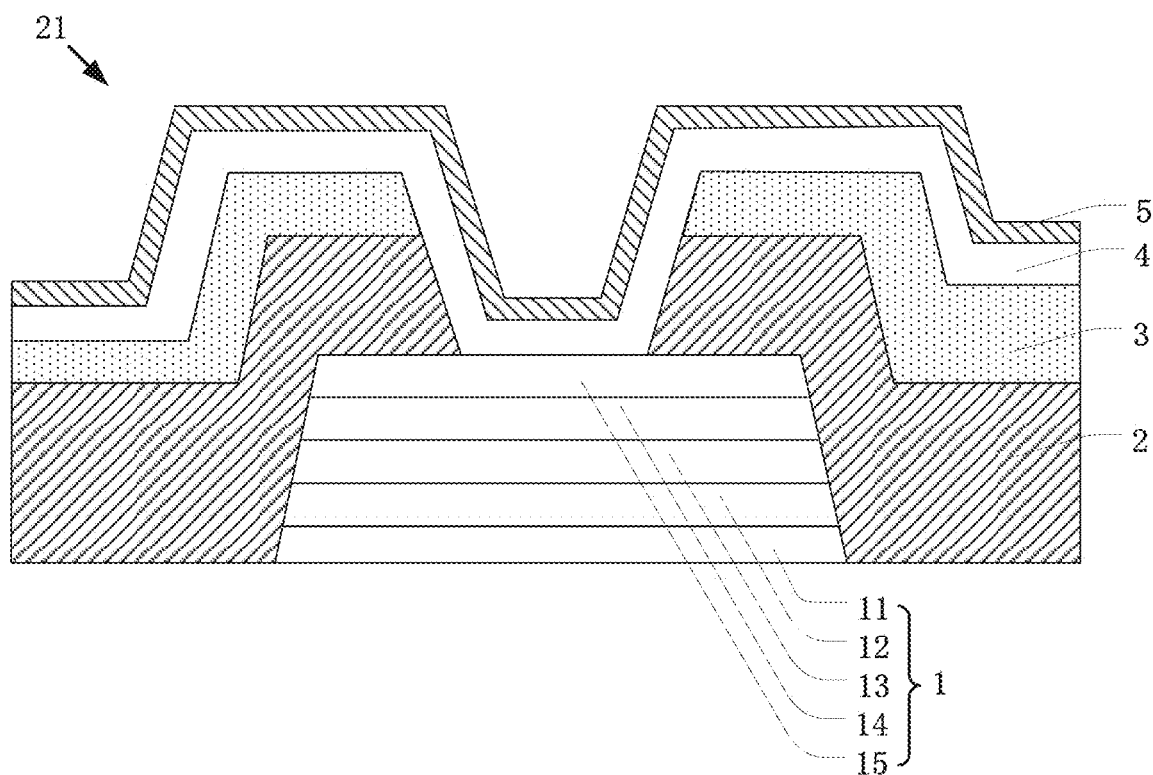
FIG. 3 is a schematic sectional diagram of a fan-out line in an embodiment of the present disclosure.

As shown in FIG. 3, the fan-out region 21 of the array substrate 100 comprises a fan-out line 1, an insulating layer 2, a passivation layer 3, and an electrode layer 4, which are arranged in a stack. The insulating layer 2 is disposed on both sides above the fan-out lines 1, wherein the fan-out lines 1 are exposed in a middle portion of the insulating layer 2. The passivation layer 3 is disposed on the insulating layer 2, wherein the fan-out lines 1 are exposed in the middle portion of the passivation layer 3. The electrode layer 4 is disposed on the insulating layer 3 and the fan-out lines 1.

In one embodiment, the fan-out region 21 comprises a barrier layer 5 disposed on the electrode layer 1 and used for obstructing external chlorine and water oxygen erosion.

The barrier layer 5 is not disposed on an upper surface of the bonding pads 220 in the bonding pad region 22, the upper surface of the bonding pads 220 is used for bonding the driving circuit to achieve electrical connection.

In order to increase corrosion resistance of the fan-out line 1, each of the fan-out lines 210 comprises a first metal layer 11, a second metal layer 12 disposed on the first metal layer 11, a third metal layer 13 disposed on the second metal layer 12, and a fourth metal layer 14 disposed on the third metal layer 13. Wherein materials of the first metal layer 11, the second metal layer 12, the third metal layer 13, and the fourth metal layer 14 are all different. It is advantageous to obstruct erosion in many different environments. When one layer is corroded, the other layers are not affected, thereby ensuring normal signal transmission.

In one embodiment, the material of the first metal layer comprises one of Ti, Cr, or Zr.

In one embodiment, the material of the second metal layer comprises Ni.

In one embodiment, the material of the third metal layer comprises Mo.

In one embodiment, the material of the fourth metal layer comprises Cu or Al.

In one embodiment, the first metal layer 11 is made of one of Ti, Cr, or Zr. Wherein, Ti, Cr, Zr are all inert metals, which have corrosion resistance. The second metal layer 12 is made of Ni, preferably, the first metal layer 11 is made of Cr. Meanwhile, a Ni—Cr structure is formed, which has good stability. In austenitic stainless steel, corrosion resistance 18Cr-9Ni<17Cr-12Ni-2.5Mo<20Cr-14Ni-3.5Mo, it is known that the higher the chromium content, the better the stability. Ni may increase stability of the austenite structure. Furthermore, on one hand, increasing Ni content may increase Ni—Cr bonding ability, which obstructs migration of Cl$^-$ ions to maximum tensile stress in the oxide film; on the other hand, increasing Ni content may increase stacking fault energy of the alloy, which make cracks and propagation difficult. Otherwise, Ni may control electrochemical behavior and control. Therefore, adopting Ni—Cr structure may greatly improve its corrosion resistance.

The material of the third metal layer 13 is made of Mo, wherein the function of Mo is to adsorb on a metal surface in a form of $MoO_4^{2-}$, which forms a protective film similar to a

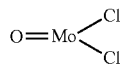

structure to prevent penetration of Cl⁻ ions.

In one embodiment, the fourth metal layer 14 is made of Cu or Al. These two materials are widely used due to their low resistivity and low price.

Thus, the fourth metal layer 14 is a Cu structure product, a structure of the fan-out line 1 is preferably Ni—Mo—Cu—Mo, Ni—Ti—Cu—Ti, Ni—Cr—Cu—Cr, Ni—Zr—Cu—Zr, Cr—Ni—Mo—Cu—Mo, Cr—Ni—Ti—Cu—Ti, Cr—Ni—Cr—Cu—Cr, and Cr—Ni—Zr—Cu—Zr. Wherein, the corrosion resistance is Ti>Cr>Zr, so Ti with strong corrosion resistance is preferred.

The fourth metal layer 14 is an Al structure product, a structure of the fan-out line 1 is preferably Ni—Mo—Al—Mo, Ni—Ti—Al—Ti, Ni—Cr—Al—Cr, Ni—Zr—Al—Zr, Cr—Ni—Mo—Al—Mo, Cr—Ni—Ti—Al—Ti, Cr—Ni—Cr—Al—Cr, and Cr—Ni—Zr—Al—Zr. Wherein, the corrosion resistance is Ti>Cr>Zr, so Ti with strong corrosion resistance is preferred.

As shown is FIG. 3, in order to increase corrosion resistance, the fan-out line 1 further comprises a fifth metal layer 15 disposed on the fourth metal layer 14.

Wherein, a material of the fifth metal layer 15 is the same as the material of the third metal layer. That is, the fifth metal layer 15 is made of Mo which has corrosion resistance. The function of Mo is to adsorb on a metal surface in a form of $MoO_4^{2-}$, which forms a protective film similar to a

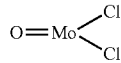

structure to prevent penetration of Cl⁻ ions. So that the fourth metal layer 14 between the material of the fifth metal layer 15 and the third metal layer 13 is protected by a double-layer.

The present disclosure further provides a display panel comprising the array substrate 100 above mentioned. The working principle of the display panel provided in this embodiment is consistent with the working principle of the foregoing embodiment of the array substrate 100. For specific structural relationship and working principle, refer to the foregoing embodiment of the array substrate 100, and will not be repeated here.

A technical effect of the present disclosure is to provide an array substrate and a display panel, which is formed a structure similar to stainless steel to increase product corrosion resistance by changing structure of the fan-out line.

Although the present invention has been described with reference to the preferred embodiments thereof, it is noted that the person having ordinary skill in the art may appreciate improvements and modifications without departing from the principle of the present invention and those improvements and modifications are considered within the scope of protection of the present invention.

What is claimed is:

1. An array substrate, comprising a display region and a non-display region;
   wherein the non-display region comprises a fan-out region and a bonding pad region;
   the fan-out region comprises a plurality of fan-out lines, and the bonding pad region comprises a plurality of bonding pads, wherein each of the fan-out lines is one-to-one connected to one of the bonding pads;
   each of the fan-out lines comprises a first metal layer, a second metal layer disposed on the first metal layer, a third metal layer disposed on the second metal layer, and a fourth metal layer disposed on the third metal layer; and
   wherein materials of the first metal layer, the second metal layer, the third metal layer, and the fourth metal layer are all different.

2. The array substrate as claimed in claim 1, wherein each of the fan-out lines comprises a fifth metal layer disposed on the fourth metal layer.

3. The array substrate as claimed in claim 2, wherein a material of the fifth metal layer is same as the material of the third metal layer.

4. The array substrate as claimed in claim 1, wherein the material of the first metal layer comprises one of Ti, Cr, or Zr.

5. The array substrate as claimed in claim 1, wherein the material of the second metal layer comprises Ni.

6. The array substrate as claimed in claim 1, wherein the material of the third metal layer comprises Mo.

7. The array substrate as claimed in claim 1, wherein the material of the fourth metal layer comprises Cu or Al.

8. The array substrate as claimed in claim 1, wherein the fan-out region further comprises
   an insulating layer disposed on both sides above the fan-out lines, wherein the fan-out lines are exposed in a middle portion of the insulating layer;
   a passivation layer disposed on the insulating layer, wherein the fan-out lines are exposed in a middle portion of the passivation layer; and
   an electrode layer disposed on the passivation layer and the fan-out lines.

9. The array substrate as claimed in claim 8, wherein the fan-out region further comprises a barrier layer disposed on the electrode layer.

10. A display panel, comprising the array substrate as claimed in claim 1.

* * * * *

UNITED STATES PATENT AND TRADEMARK OFFICE
CERTIFICATE OF CORRECTION

PATENT NO. : 11,112,669 B2
APPLICATION NO. : 16/623770
DATED : September 7, 2021
INVENTOR(S) : Junzheng Liu et al.

Page 1 of 1

It is certified that error appears in the above-identified patent and that said Letters Patent is hereby corrected as shown below:

On the Title Page

Item (30) Foreign Application Priority Data, insert the following:
--Nov 26, 2019 (CN)...................201911172765.2--

Item (87), Line 1, PCT Pub. No. "WO2020/114499" should be changed to --WO2021/103086--

Item (87), Line 2, PCT Pub. Date, "June 11, 2020" should be changed to --June 3, 2021--

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*